(12) United States Patent
Winkler

(10) Patent No.: US 11,788,190 B2
(45) Date of Patent: Oct. 17, 2023

(54) LIQUID VAPORIZER

(71) Applicant: ASM IP HOLDING B.V., Almere (NL)

(72) Inventor: Jereld Lee Winkler, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 522 days.

(21) Appl. No.: 16/911,189

(22) Filed: Jun. 24, 2020

(65) Prior Publication Data

US 2021/0002767 A1   Jan. 7, 2021

Related U.S. Application Data

(60) Provisional application No. 62/871,036, filed on Jul. 5, 2019.

(51) Int. Cl.
| | | |
|---|---|---|
| *C23C 16/455* | (2006.01) | |
| *C23C 16/448* | (2006.01) | |
| *H01L 21/67* | (2006.01) | |

(52) U.S. Cl.
CPC .... *C23C 16/45557* (2013.01); *C23C 16/4481* (2013.01); *C23C 16/45527* (2013.01); *C23C 16/45544* (2013.01); *C23C 16/45561* (2013.01); *C23C 16/45587* (2013.01); *H01L 21/67017* (2013.01)

(58) Field of Classification Search
CPC .......... C23C 16/4481; C23C 16/45587; C23C 16/45557; C23C 16/45544; C23C 16/45561

See application file for complete search history.

(56) References Cited

U.S. PATENT DOCUMENTS

| | | |
|---|---|---|
| 4,511,593 A | 4/1985 | Brandolf |
| 4,859,375 A | 8/1989 | Lipisko et al. |
| 5,014,211 A | 5/1991 | Turner et al. |
| 5,122,252 A | 6/1992 | Latz et al. |
| 5,227,340 A | 7/1993 | Pintchovski et al. |
| 5,279,338 A | 1/1994 | Goossens |
| 5,336,533 A | 8/1994 | Balmashnov |
| 5,362,328 A | 11/1994 | Gardiner et al. |
| 5,366,555 A | 11/1994 | Kelly |

(Continued)

FOREIGN PATENT DOCUMENTS

| | | |
|---|---|---|
| WO | WO 01/36702 A1 | 5/2001 |
| WO | WO 01/38601 A1 | 5/2001 |

(Continued)

OTHER PUBLICATIONS

Avril, L. et al., "Pulsed direct liquid injection ALD of TiO2 films using titanium tetraisopropoxide precursor," Physics Procedia, 2013, vol. 46, pp. 33-39.

(Continued)

*Primary Examiner* — Joseph A Miller, Jr.
(74) *Attorney, Agent, or Firm* — Snell & Wilmer L.L.P.

(57) ABSTRACT

A semiconductor processing device is disclosed. The semiconductor device includes a reactor and a vaporizer configured to provide a reactant vapor to the reactor. The device can include a process control chamber between the vaporizer and the reactor. The device can include a control system configured to modulate a pressure in the process control chamber based at least in part on feedback of measured pressure in the process control chamber.

22 Claims, 4 Drawing Sheets

(56) References Cited

U.S. PATENT DOCUMENTS

| | | | |
|---|---|---|---|
| 5,551,309 A | 9/1996 | Goossens et al. | |
| 5,620,524 A | 4/1997 | Fan et al. | |
| 5,702,532 A | 12/1997 | Wen et al. | |
| 5,803,938 A | 9/1998 | Yamaguchi et al. | |
| 5,981,049 A | 11/1999 | Ohara et al. | |
| 6,019,849 A | 2/2000 | Yao et al. | |
| 6,036,783 A | 3/2000 | Fukunaga et al. | |
| 6,074,487 A | 6/2000 | Yoshioka et al. | |
| 6,138,691 A | 10/2000 | Voloshin et al. | |
| 6,155,540 A | 12/2000 | Takamatsu et al. | |
| 6,176,930 B1 | 1/2001 | Koai et al. | |
| 6,199,599 B1 | 3/2001 | Gregg et al. | |
| 6,258,170 B1 | 7/2001 | Somekh et al. | |
| 6,258,171 B1 | 7/2001 | Agarwal | |
| 6,261,374 B1 | 7/2001 | Bang et al. | |
| 6,280,844 B1 | 8/2001 | Vesnovsky et al. | |
| 6,287,965 B1 | 9/2001 | Kang et al. | |
| 6,296,026 B1 | 10/2001 | Gregg et al. | |
| 6,342,277 B1 | 1/2002 | Sherman | |
| 6,358,323 B1 | 3/2002 | Schmitt et al. | |
| 6,419,462 B1 | 7/2002 | Horie et al. | |
| 6,435,224 B2 | 8/2002 | Blatt et al. | |
| 6,457,494 B1 | 10/2002 | Gregg et al. | |
| 6,555,165 B2 | 4/2003 | Takeshima | |
| 6,576,063 B2 | 6/2003 | Toyoda et al. | |
| 6,596,085 B1 | 7/2003 | Schmitt et al. | |
| 6,604,555 B2 | 8/2003 | Blatt et al. | |
| 6,780,704 B1 | 8/2004 | Raaijmakers et al. | |
| 6,815,043 B2 | 11/2004 | Fleming et al. | |
| 6,881,263 B2 | 4/2005 | Lindfors et al. | |
| 6,889,524 B2 | 5/2005 | O'Connor et al. | |
| 6,921,062 B2 | 7/2005 | Gregg et al. | |
| 6,953,047 B2 | 10/2005 | Birtcher et al. | |
| 7,022,336 B2 | 4/2006 | Papahadjopoulos et al. | |
| 7,109,113 B2 | 9/2006 | Derderian | |
| 7,122,085 B2 | 10/2006 | Shero et al. | |
| 7,156,380 B2 | 1/2007 | Soininen | |
| 7,192,486 B2 | 3/2007 | Bang et al. | |
| 7,334,595 B2 | 2/2008 | Birtcher et al. | |
| 7,334,708 B2 | 2/2008 | Xu et al. | |
| 7,462,603 B2 | 12/2008 | Papahadjopoulos et al. | |
| 7,575,012 B2 | 8/2009 | Miki et al. | |
| 7,775,236 B2 | 8/2010 | Gold et al. | |
| 7,779,785 B2 | 8/2010 | Miya et al. | |
| 7,846,497 B2 | 12/2010 | Gold et al. | |
| 7,959,994 B2 | 6/2011 | Spohn et al. | |
| 8,012,261 B2 | 9/2011 | Sneh | |
| 8,012,876 B2 | 9/2011 | Oosterlaken | |
| 8,074,677 B2 | 12/2011 | Gold et al. | |
| 8,114,479 B2 | 2/2012 | Spohn et al. | |
| 8,468,840 B2 | 6/2013 | Burgers et al. | |
| 8,584,965 B2 | 11/2013 | Buillon et al. | |
| 8,821,640 B2 | 9/2014 | Cleary et al. | |
| 9,238,865 B2 | 1/2016 | Pomarede et al. | |
| 9,455,137 B2 | 9/2016 | Hirose et al. | |
| 9,593,422 B2 | 3/2017 | Asai et al. | |
| 9,873,942 B2 | 1/2018 | Pomarede et al. | |
| 2002/0001612 A1 | 1/2002 | Papahadjopoulos et al. | |
| 2002/0043215 A1 | 4/2002 | Yoshioka et al. | |
| 2002/0062789 A1* | 5/2002 | Nguyen | C23C 16/0281 |
| | | | 427/255.28 |
| 2002/0182249 A1 | 12/2002 | Papahadjopoulos et al. | |
| 2002/0192375 A1 | 12/2002 | Sun et al. | |
| 2003/0003143 A1 | 1/2003 | Papahadjopoulos et al. | |
| 2003/0009044 A1 | 1/2003 | Jungermann | |
| 2003/0012709 A1 | 1/2003 | Xu et al. | |
| 2003/0072975 A1 | 4/2003 | Shero et al. | |
| 2003/0075273 A1 | 4/2003 | Kilpela et al. | |
| 2003/0111007 A1 | 6/2003 | Takamatsu et al. | |
| 2003/0111012 A1 | 6/2003 | Takeshima | |
| 2003/0145789 A1 | 8/2003 | Bauch et al. | |
| 2003/0211736 A1* | 11/2003 | Ludviksson | H01L 21/76843 |
| | | | 438/683 |
| 2004/0023456 A1 | 2/2004 | Lee et al. | |
| 2004/0062862 A1 | 4/2004 | Ahn et al. | |
| 2004/0089235 A1* | 5/2004 | Yamada | B01F 23/10 |
| | | | 118/715 |
| 2004/0094092 A1 | 5/2004 | Derderian et al. | |
| 2004/0163590 A1 | 8/2004 | Tran et al. | |
| 2004/0209366 A1 | 10/2004 | Papahadjopoulos et al. | |
| 2005/0016956 A1 | 1/2005 | Liu et al. | |
| 2005/0070126 A1 | 3/2005 | Senzaki | |
| 2005/0072357 A1 | 4/2005 | Shero et al. | |
| 2005/0170509 A1 | 8/2005 | Papahadjopoulos et al. | |
| 2005/0229970 A1 | 10/2005 | Birtcher et al. | |
| 2005/0287299 A1 | 12/2005 | Ahn et al. | |
| 2006/0033678 A1 | 2/2006 | Lubormirsky et al. | |
| 2006/0099340 A1 | 5/2006 | Behle et al. | |
| 2006/0130896 A1 | 6/2006 | Skibinski | |
| 2006/0133955 A1 | 6/2006 | Peters | |
| 2006/0147513 A1 | 7/2006 | Papahadjopoulos et al. | |
| 2006/0156980 A1 | 7/2006 | Won et al. | |
| 2006/0246177 A1 | 11/2006 | Miki et al. | |
| 2007/0042119 A1 | 2/2007 | Matthysse et al. | |
| 2007/0163713 A1* | 7/2007 | Kasai | H01L 21/67017 |
| | | | 156/345.34 |
| 2008/0178809 A1 | 7/2008 | Spohn et al. | |
| 2008/0179767 A1 | 7/2008 | Spohn et al. | |
| 2008/0182010 A1 | 7/2008 | Spohn et al. | |
| 2008/0182023 A1 | 7/2008 | Spohn et al. | |
| 2008/0182425 A1 | 7/2008 | Spohn et al. | |
| 2008/0020261 A1 | 8/2008 | Gold et al. | |
| 2008/0202588 A1 | 8/2008 | Gold et al. | |
| 2008/0213476 A1 | 9/2008 | Spohn et al. | |
| 2009/0061648 A1 | 3/2009 | Horii et al. | |
| 2009/0065351 A1 | 3/2009 | Nuss | |
| 2009/0078791 A1 | 3/2009 | Guillon et al. | |
| 2009/0107089 A1 | 4/2009 | Chung | |
| 2009/0202609 A1 | 8/2009 | Keough et al. | |
| 2009/0211525 A1 | 8/2009 | Sarigiannis et al. | |
| 2009/0214777 A1 | 8/2009 | Sarigiannis et al. | |
| 2009/0214778 A1 | 8/2009 | Sarigiannis et al. | |
| 2009/0214779 A1 | 8/2009 | Sarigiannis et al. | |
| 2009/0266296 A1* | 10/2009 | Tachibana | C23C 16/4485 |
| | | | 118/715 |
| 2009/0283029 A1 | 11/2009 | Arena et al. | |
| 2010/0018249 A1 | 1/2010 | Burgers et al. | |
| 2010/0255198 A1 | 10/2010 | Clearly et al. | |
| 2010/0266765 A1 | 10/2010 | White et al. | |
| 2011/0143034 A1 | 6/2011 | Ahn et al. | |
| 2011/0293832 A1 | 12/2011 | Gersdorff et al. | |
| 2011/0311725 A1* | 12/2011 | Sneh | C23C 16/402 |
| | | | 423/407 |
| 2012/0073672 A1* | 3/2012 | Ding | C23C 16/45523 |
| | | | 156/345.33 |
| 2021/0087679 A1 | 3/2021 | Winkler et al. | |
| 2021/0180184 A1 | 6/2021 | Verni et al. | |
| 2021/0371978 A1 | 12/2021 | Shero et al. | |

FOREIGN PATENT DOCUMENTS

| | | |
|---|---|---|
| WO | WO 2004/010469 A2 | 1/2004 |
| WO | WO 2009/147156 A1 | 12/2009 |

OTHER PUBLICATIONS

Erben, E. et al. (Infineon), ALD conference 2004, Helsinski, Finland.

Liu, X. et al. (Genus),"ALD of Hafnium Oxide Thin Films from Tetrakis Hafnium and Ozone" JECS 152 (2005) G213.

Noah, Craig, "Liquid & Vapor Delivery for ALD/CVD/MOCVD Nanotechnology Development," UGIM 2016 Symposium, University of Utah, Jun. 12-15, 2016, UGIM 2016, 27 pages.

Schroeder et al. (Infineon), Recent Developments in ALD Technology for 50nm Trench DRAM Applications) ECS conference, Los Angeles, Oct. 2005.

Schroeder et al. (Infineon), "Recent Developments in ALD Technology for 50nm Trench DRAM Applications," ECS Transactions, 1 (5), pp. 125-132 (2006) 10.1149/1.2209261.

Suntola, T., e.g., in the Handbook of Crystal Growth 3, Thin Films and Epitaxy, Part B: Growth mechanisms and Dynamics, Chapter 14, Atomic Layer Epitaxy, pp. 601-663, Elsevier Science B.V. 1994.

(56) References Cited

OTHER PUBLICATIONS

Verghese et al. (ASM America), "Solid Source Design Impact on Atomic Layer Deposition", ECS conference, Los Angeles, Oct. 19, 2005.
"Aerosol, n.". OED Online. Jun. 2015. Oxford University Press. http://www.oed.com/view/Entry/3203?result=1 &rskey=FJvv7R& (accessed Jul. 12, 2015).

* cited by examiner

LIQUID VAPORIZER

CROSS-REFERENCE TO RELATED APPLICATIONS

This application claims priority to U.S. Provisional Patent Application No. 62/871,036, filed Jul. 5, 2019, the entire contents of which are incorporated by reference herein in their entirety and for all purposes.

BACKGROUND

Field

The field relates to a liquid vaporizer, for example, a liquid vaporizer for a semiconductor processing device.

Description of the Related Art

During semiconductor processing, various reactant vapors are fed into a reaction chamber. In some applications, the reactant vapors are stored in gaseous form in a reactant source vessel. In such applications, the reactant vapors are often gaseous at ambient pressures and temperatures. However, in some cases, the vapors of source chemicals that are liquid or solid at ambient pressure and temperature are used. These substances may be heated to produce sufficient amounts of vapor for the reaction process, such as vapor deposition. Chemical Vapor Deposition (CVD) for the semiconductor industry may call for continuous streams of reactant vapor, and Atomic Layer Deposition (ALD) may call for continuous streams or pulsed supply, depending on the configuration. In both cases it can be important to know with some accuracy the amount of reactant supplied per unit time or per pulse in order to control the doses and effect on the process.

For some solid and liquid substances, the vapor pressure at room temperature is so low that they have to be heated to produce a sufficient amount of reactant vapor and/or maintained at very low pressures. Once vaporized, it is important that the vapor phase reactant is kept in vapor form through the processing system so as to prevent undesirable condensation in reaction chamber, and in the valves, filters, conduits and other components associated with delivering the vapor phase reactants to the reaction chamber. Vapor phase reactant from such solid or liquid substances can also be useful for other types of chemical reactions for the semiconductor industry (e.g., etching, doping, etc.) and for a variety of other industries, but are of particular concern for metal and semiconductor precursors employed, e.g., in CVD or ALD. However, there remains a continuing demand for improved formation and delivery of reactant vapor to the reactor.

SUMMARY

In one embodiment, a semiconductor processing device is disclosed. The device can include a reactor and a vaporizer configured to provide a reactant vapor to the reactor. The device can include a process control chamber between the vaporizer and the reactor. The device can include a control system configured to modulate a pressure in the process control chamber based at least in part on feedback of measured pressure in the process control chamber.

In another embodiment, a device for forming a vaporized reactant is disclosed. The device can include a vaporizer configured to vaporize a reactant source into a reactant vapor, the vaporizer disposed in a first thermal zone at a first temperature. The device can include a process control chamber downstream of the vaporizer, the process control chamber disposed in a second thermal zone at a second temperature that is higher than the first temperature. The device can include a control system configured to maintain a first pressure in the vaporizer at or below a dew point pressure of the reactant vapor at the first temperature. The control system can be configured to modulate a pressure in the process control chamber based at least in part on feedback of measured pressure in the process control chamber.

In another embodiment, a method of forming a vaporized reactant is disclosed. The method can include supplying a reactant source to a vaporizer, the vaporizer disposed in a first thermal zone at a first temperature. The method can include vaporizing the reactant source to form a reactant vapor. The method can include maintaining a pressure in the vaporizer at or below a total vapor pressure of the reactant vapor at the first temperature. The method can include transferring the reactant vapor to a process control chamber, the process control chamber disposed in a second thermal zone at a second temperature that is greater than the first temperature. The method can include modulating a pressure in the process control chamber based at least in part on feedback of measured pressure in the process control chamber.

In another embodiment, a device for forming a vaporized reactant is disclosed. The device can include a vaporizer configured to form a reactant vapor from a liquid reactant. The device can include a process control chamber downstream of the vaporizer. The device can include a control system configured to modulate a pressure in the process control chamber based at least in part on feedback of measured pressure in the process control chamber.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1:
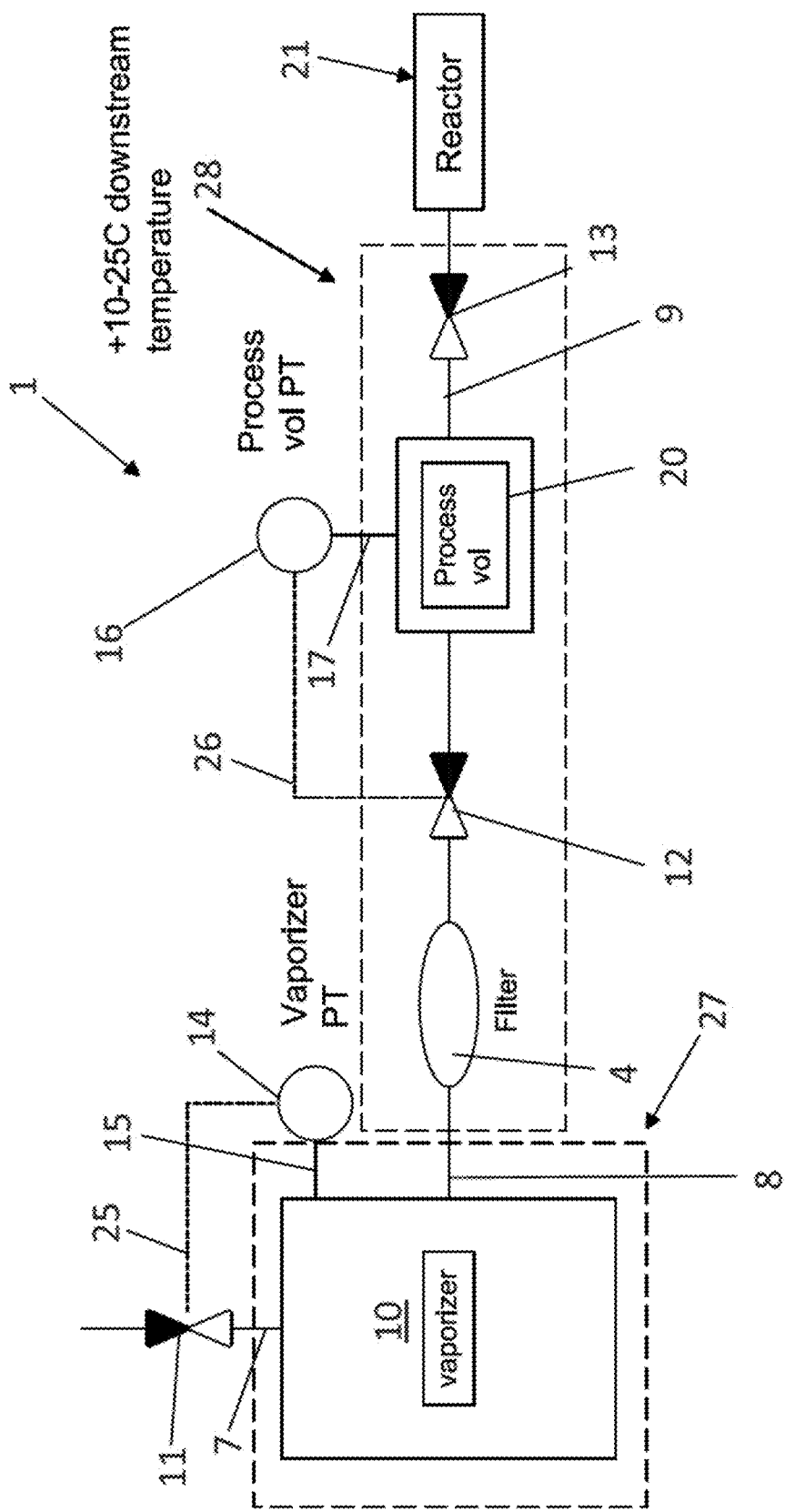
FIG. 1 is a schematic system diagram of a semiconductor processing device, according to various embodiments.

The embodiments disclosed herein relate to improved liquid vaporizers (e.g., direct liquid injection vaporizers) for vaporizing reactant liquids for use in a semiconductor processing device. The embodiments disclosed herein can be used in conjunction with any suitable type of semiconductor processing device, including an atomic layer deposition (ALD) device, a chemical vapor deposition (CVD) device, a metalorganic CVD (MOCVD) device, a physical vapor deposition device (PVD), etc.

For example, ALD is a method for growing highly uniform thin films onto a substrate. In a time-divided ALD reactor, the substrate is placed into reaction space free of impurities and at least two different precursors (reactant vapors) are injected in vapor phase alternately and repetitively into the reaction space. Reactant vapors can accordingly comprise a vapor that includes one or more precursors and one or more solvents. The film growth is based on alternating surface reactions that take place on the surface of the substrate to form a solid-state layer of atoms or molecules, because the reactants and the temperature of the substrate are chosen such that the alternately-injected vapor-phase precursor's molecules react only on the substrate with its surface layer. The reactants are injected in sufficiently high doses for the surface to be practically saturated during each injection cycle. Therefore, the process is highly self-regulating, being not dependent on the concentration of the starting materials, whereby it is possible to achieve extremely high film uniformity and a thickness accuracy of a single atomic or molecular layer. Similar results are obtained in space-divided ALD reactors, where the substrate is moved into zones for alternate exposure to different reactants. Reactants can contribute to the growing film (precursors) and/or serve other functions, such as stripping ligands from an adsorbed species of a precursor to facilitate reaction or adsorption of subsequent reactants.

The ALD method can be used for growing both elemental and compound thin films. ALD can involve alternate two or more reactants repeated in cycles, and different cycles can have different numbers of reactants. Pure ALD reactions tend to produce less than a monolayer per cycle, although variants of ALD may deposit more than a monolayer per cycle.

Growing a film using the ALD method can be a slow process due to its step-wise (layer-by-layer) nature. At least two gas pulses are alternated to form one layer of the desired material, and the pulses are kept separated from each other for preventing uncontrolled growth of the film and contamination of the ALD reactor. After each pulse, the gaseous reaction products of the thin-film growth process as well as the excess reactants in vapor phase are removed from the reaction space, or the substrate is removed from the zone that contains them. In time-divided examples, this can be achieved by pumping down the reaction space, by purging the reaction space with an inactive gas flow between successive pulses, or both. Purging employs a column of an inactive gas in the conduits between the reactant pulses. Purging is widely employed on production scale because of its efficiency and its capability of forming an effective diffusion barrier between the successive pulses. Regularly, the inert purging gas is also used as a carrier gas during reactant pulses, diluting the reactant vapor before it is fed into the reaction space.

Sufficient substrate exposure and good purging of the reaction space are desirable for a successful ALD process. That is, the pulses should be intense enough for the substrate to be practically saturated (in the flattened portion of the asymptotic saturation curve) and purging should be efficient enough to remove practically all precursor residues and undesired reaction products from the reactor. Purge times can be relatively long with respect to the precursor exposure times.

As explained above, liquid precursors (or precursor-solvent mixtures) can be evaporated in a vaporizer such as a liquid injection vaporizer, to form a reactant vapor to be delivered to the reactor or reaction chamber. However, in some devices, the pressure and temperature at portions of the system between the vaporizer and the reaction chamber may vary. Variations in the temperature and/or pressure within the process control chamber (or other such variations along the pathway between the vaporizer and the reaction chamber) may cause the vaporized reactant to condense into droplets of liquid. Condensation of reactant vapor upstream of the reaction chamber can result in the presence of liquid droplets within the reaction chamber, which can cause defects in the processed substrate (e.g., processed wafer) and reduce processing yields.

Moreover, in various semiconductor processing devices, the vaporizer is purged of reactant gases by supplying an inactive gas to the vaporizer between cycles. The vaporizer may have a large volume in some devices, and the time to purge such large volumes may significantly lower throughput. In some processing devices, excess particles may be created in the reaction chamber due to large pressure fluctuations resulting from inadequate flow rate control per pulse. In addition, it may be challenging to place a filter upstream of the reactor, which can lead to the transfer of liquid droplets to the reaction chamber and substrate.

Figure 2:
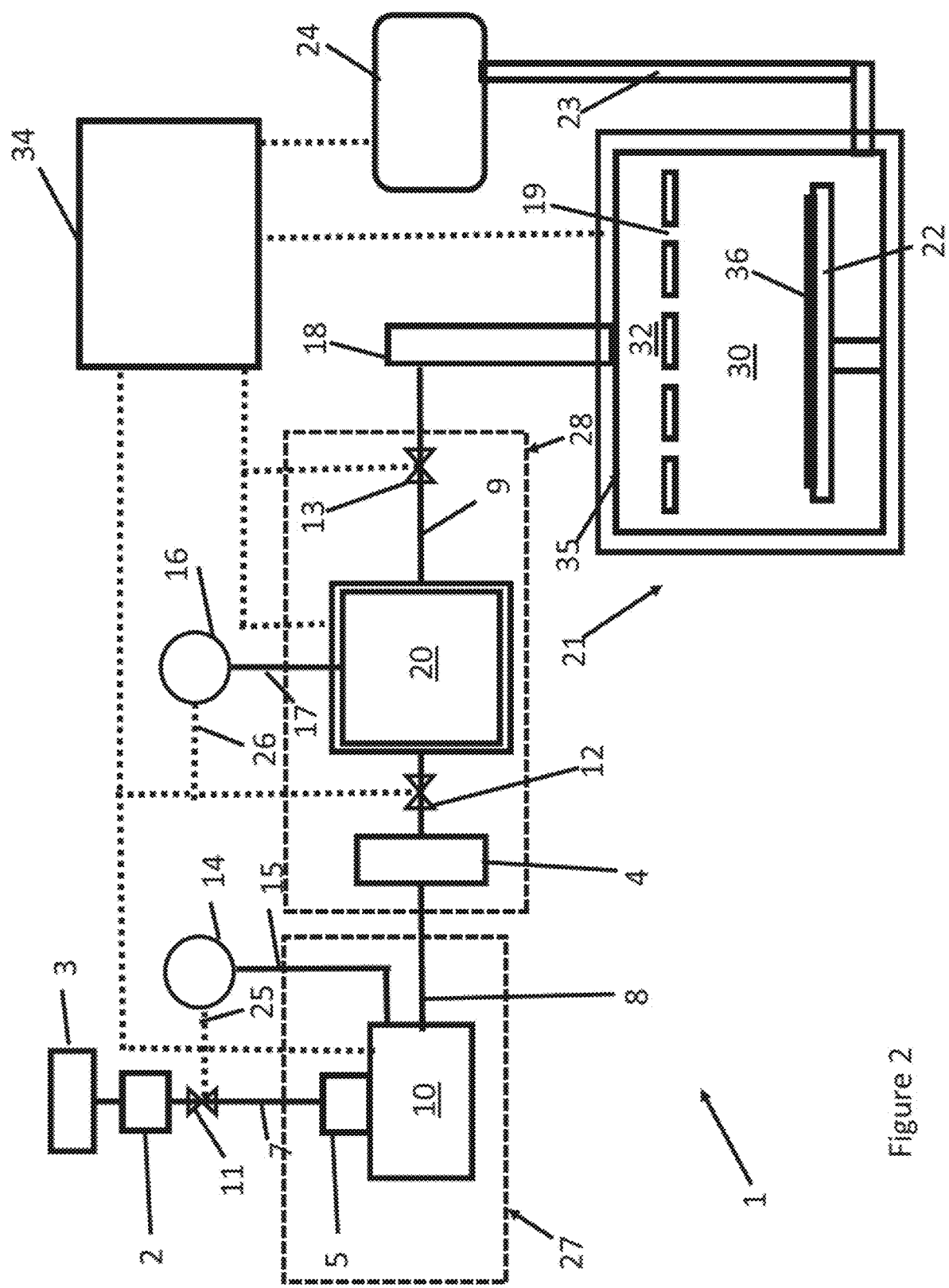
FIG. 2 is a schematic system diagram of the semiconductor processing device of FIG. 1, including a liquid reactant source.

FIG. 1 is a schematic system diagram of a semiconductor processing device 1, according to various embodiments. FIG. 2 is a schematic system diagram of the semiconductor processing device of FIG. 1, including a liquid reactant source 3 that supplies a liquid reactant to a liquid vaporizer 10. The liquid vaporizer 10 can supply vaporized reactant to a process control chamber 20, which is configured to ensure reactant remains in vapor form for supply to a reactor assembly, or reactor 21. The liquid reactant can comprise a liquid precursor, or a mixture of a liquid precursor (e.g., zirconium metalorganic, or Zr MO, such as zirconium amino alkoxides, for example, $Zr(dmae)_4$, $Zr(dmae)_2(OtBu)_2$, and $Zr(dmae)_2(OiPr)_2$, with dmae being dimethylaminoethoxide, $[OCH_2CH_2N(CH_3)_2]$) and a solvent (e.g., octane). The liquid reactant source 3 can supply the liquid reactant to the vaporizer 10 along a liquid injection line 7. A liquid mass flow controller (liquid MFC) 2 can be provided to control or meter the flow of liquid reactant along the liquid injection line 7. A first valve 11 can regulate the flow (e.g., pressure and/or flow rate) of the liquid reactant into the vaporizer 10. The first valve 11 can comprise any suitable type of valve. For example, in various embodiments, the first valve 11 can comprise an adjustable valve having a plurality of flow conductance settings to regulate the flow rate through the liquid injection line 7.

An atomizer or injector 5 can be provided along the liquid injection line 7 to atomize the liquid reactant into a high speed spray to be delivered to the vaporizer 10. As explained herein, the pressure and temperature of the vaporizer 10 can be controlled such that the injected liquid reactant is evaporated into reactant vapor. The reactant vapor can be supplied along a first reactant vapor supply line 8 to a filter 4. The filter can be configured to capture and evaporate any droplets that are present due to incomplete vaporization or condensation.

In various embodiments, as disclosed herein, the reactant vapor, which may be mixture of reactant and vaporized solvent, can be supplied along the first supply line 8, without using a separate inactive carrier gas supply. Omitting a separate inactive gas source to carry the reactant vapor through the first supply line 8 can beneficially reduce the costs and complexity associated with the device 1. Moreover, as explained above, the volume of the vaporizer 10 may be large, such that repeated purging of the vaporizer 10 reduces throughput. In the illustrated embodiment, the solvent vapor supplied along with the liquid reactant can serve to carry the reactant and form part of the reactant vapor from the vaporizer 10, which can obviate the need for a separate carrier gas supply to the vaporizer 10.

The process control chamber 20 can be disposed between the vaporizer 10 and the reactor 21. The process control chamber 20 can meter or control the amount of reactant vapor that is supplied to the reactor 21 along a second reactant vapor supply line 9. Accordingly, the process control chamber 20 can be configured to control the pulse-width and timing of pulse delivery to the reactor 21.

A second valve 12 can be disposed upstream of the process control chamber 20. In the illustrated embodiment, the second valve 12 can be disposed between the filter 4 and the process control chamber 20. In other embodiments, the second valve 12 can be disposed between the filter 4 and the vaporizer 10. The second valve 12 can comprise an adjustable valve to control flow conductance of the vaporized reactant. A third valve 13 can be disposed downstream of the process control chamber 20, e.g., between the process control chamber 20 and the reactor 21. The third valve 13 can comprise an adjustable valve to control flow conductance, in some embodiments. Other types of valves may be suitable in other embodiments.

The second reactant vapor supply line 9 can supply the reactant vapor to an inlet manifold 18 of the reactor 21. The inlet manifold 18 can supply the reactant vapor to a reaction chamber 30 of the reactor 21. A dispersion device 35, such as a showerhead as shown, or a horizontal injection device in other embodiments, can include a plenum 32 in fluid communication with a plurality of openings 19. The reactant vapor can pass through the openings 19 and to be supplied into the reaction chamber 30. A substrate support 22 can be configured, or sized and shaped, to support a substrate 36, such as a wafer, within the reaction chamber 30. The dispersed reactant vapor can contact the substrate and react to form a layer (e.g., a monolayer) on the substrate. The dispersion device 35 can disperse the reactant vapor in a manner so as to form a uniform layer on the substrate.

An exhaust line 23 can be in fluid communication with the reaction chamber 30. A vacuum pump 24 can apply suction to the exhaust line 23 to evacuate vapors and excess materials from the reaction chamber 30. The reactor 21 can comprise any suitable type of semiconductor reactor, such as an atomic layer deposition (ALD) device, a chemical vapor deposition (CVD) device, etc.

In the embodiment of FIGS. 1 and 2, a first pressure transducer 14 can monitor the pressure within the vaporizer 10 by way of a first transducer line 15. A second pressure transducer 16 can monitor the pressure within the process control chamber 20 by way of a second transducer line 17. A first feedback circuit 25 can electrically connect the first pressure transducer 14 with the first valve 11. A second feedback circuit 26 can electrically connect the second transducer 16 with the second valve 12. A control system 34 can control the operation of various components of the device 1. The control system 34 can comprise processing electronics configured to control the operation of one or more of the first valve 11, the second valve 12, the first pressure transducer 14, the second transducer 16, the third valve 13, the reactor 21 (and the various components therein), and the vacuum pump 24.

Although illustrated as a single structure in FIG. 2, it should be appreciated that the control system 34 can include a plurality of controllers or sub-systems that have processors, memory devices, and other electronic components that control the operation of the various components of the device 1. The term control system (or controller) includes any combination of individual controller devices and processing electronics that may be integrated with or connected to other devices (such as valves, sensors, etc.). Thus, in some embodiments, the control system 34 can include a centralized controller that controls the operation of multiple (or all) system components. In some embodiments, the control system 34 can comprise a plurality of distributed controllers that control the operation of one or more system components.

As explained above, inadequate vaporization or condensation can lead to deformities in film growth in the reaction chamber 30, which can reduce yield. Moreover, some processing devices may deliver reactant vapor from a vaporizer to a reactor without any intervening process control chamber or valving arrangements, which can lead to the delivery of liquid to the reaction chamber 30. Beneficially, the embodiment of FIGS. 1 and 2 can include feedback control of measured pressure in the vaporizer 10 and in the process control chamber 20.

As shown in FIG. 1, the device 1 can include a first thermal zone 27 that is maintained at a first temperature and a second thermal zone 28 that is maintained at a second temperature. In various embodiments, the second temperature of the second thermal zone 28 can be higher than the first temperature of the first thermal zone 27. In various embodiments, for example, the second temperature can be higher than the first temperature by a temperature difference in a range of 5° C. to 50° C., in a range of 5° C. to 35° C., or in a range of 10° C. to 25° C. The first thermal zone 27 can comprise the vaporizer 10. The second thermal zone 28 can comprise the filter 4, the second valve 12, the process control chamber 20, and the third valve 9, along with the supply lines that connect the components within the second thermal zone 28. If the thermal zones 27, 28 are separated, then portions of the supply line 8 between the zones can be provided with heater jackets to maintain the line at or above the temperature of the first thermal zone 27.

Placing the filter 4 within the heated second thermal zone 28 can beneficially elevate enhance the capture and evaporation of liquid droplets that may be delivered through the filter 4. The high temperature filter 4 can obviate the use of a separate droplet size control mechanism (e.g., high flow inactive gas injection) or flash contactless injection. Moreover, placing the vaporizer 10 and process control chamber 20 in heated zones that are at different temperatures can enable the device 1 to fine tune reactor process parameters. For example, the first and second valves 11, 12 can be adjusted by the control system 34 to increase or decrease solvent and precursor flow rate into the reactor in order to obtain desired processing reactor parameters.

For example, a first pressure set point for the vaporizer 10 can be calculated based at least in part on a particular reactant-solvent mixture, the temperature of the first thermal zone 27, the volume of the vaporizer 10, the flow rate through the vaporizer 10, and the dew point pressure (e.g., the approximate maximum pressure at which the reactant remains in vapor form, as used herein) of the reactant material at the temperature of the vaporizer 10. The calculated first pressure set point can set an upper bound for the pressure within the vaporizer 10, and can be input into the control system 34. The first pressure transducer 14 can monitor the pressure in the vaporizer 10, and can feed back the measured pressure to the first valve 11 along the first feedback circuit 25, and/or the control system 34. The feedback circuit 25 and/or the control system 34 can use any suitable closed loop control techniques to maintain the pressure in the vaporizer 10 at or below the first pressure set point. For example, the control system 34 can calculate a difference between the measured pressure and the first pressure set point. Based on the calculated difference, the control system 34 can send a control signal to the first valve 11 to adjust the flow conductance setting of the valve 11 to adjust the pressure of the vaporizer 10 to maintain the pressure at or below the reactant dew point pressure at the first temperature.

As an example of determining a pressure set point for the valve 11 (or valve 12), the specific gravity of the mixture of reactant and solvent can be calculated. In a first example, for a mixture that utilizes 50% zirconium metal-organic (ZrMO) (e.g., zirconium amino alkoxides) as the reactant and 50% octane as the solvent, the specific gravity can be about 0.961. In this example, the flow rate of the mixture can be about 0.00133 g-liquid/msec. For a set temperature of 150° C. in the first thermal zone 27, the corresponding vapor pressure of ZrMO can be about 45 torr. The corresponding total vapor pressure for a vaporizer 10 having a volume of 0.5 L is approximately 159 torr, which can be the first pressure set point for the first valve 11. The pressure set points will of course vary, depending on the mixture composition and process parameters. As a second example with process parameters the same as for the first example, a 20% ZrMO reactant and 80% octane solvent mixture has a total vapor pressure of about 500 torr.

Similarly, a second pressure set point for the process control chamber 20 can be calculated based at least in part on the reactant-solvent mixture, the temperature of the second thermal zone 28, the volume of the process control chamber 20, the flow rate through the process control chamber 20, and the known dew point pressure of the reactant material at the temperature of the process control chamber 20. The calculated second pressure set point can set an upper bound for the pressure within the process control chamber 20, and can be input into the control system 34. The second pressure transducer 16 can monitor the pressure in the process control chamber 20, and can feed back the measured pressure to the second valve 12 along the second feedback circuit 26, and/or the control system 34. The second feedback circuit 26 and/or the control system 34 can use any suitable closed loop control techniques to maintain the pressure in the process control volume 20 at or below the second pressure set point. For example, the control system 34 can calculate a difference between the measured pressure and the second pressure set point. Based on the calculated difference, the control system 34 can send a control signal to the second valve 12 to adjust the flow conductance setting of the valve 12 to adjust the pressure of the process control chamber 20 to maintain the pressure at or below the reactant dew point pressure at the second temperature.

Accordingly, the valves 11, 12, the pressure transducers 14, 16, and the feedback circuits 25, 26 can accurately control the respective pressures in the vaporizer 10 and the process control chamber 20 to prevent condensation and inadequate vaporization. Furthermore, because two feedback circuits 25, 26 are provided for two thermal zones 27, 28 maintained at different temperatures, the device 1 can fine tune reactor processing parameters and reactant flow rates. For example, in some embodiments, the control system 34 can be configured to step down a pressure of the reactant vapor upstream of the process control chamber 20. Since the second temperature of the second thermal zone 28 may be higher than the first temperature of the first thermal zone 27, the reactant vapor does not condense even at lower pressures, while the step down in pressure can help modulate the dose of reactant gas to the reactor and stabilize the reaction process. In other embodiments, the control system 34 can be configured to step up, or otherwise adjust, the pressure upstream of the process control chamber 20 in order to tune reaction processing parameters.

Figure 3:
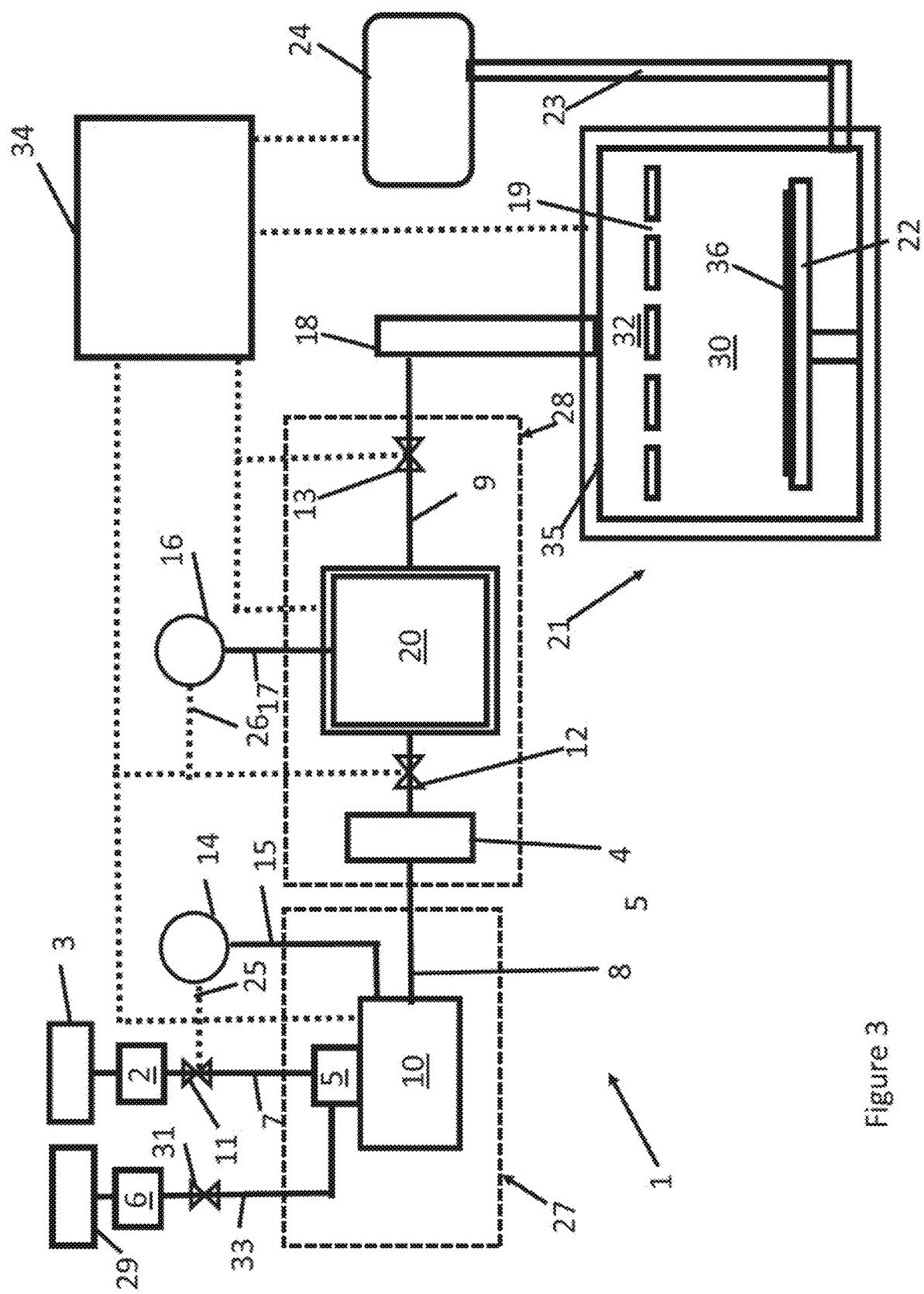
FIG. 3 is a schematic system diagram of a semiconductor processing device including a liquid reactant source and an inactive gas source, according to another embodiment.

FIG. 3 is a schematic system diagram of the semiconductor processing device of FIG. 1, including a liquid reactant source 3 and an inactive gas source 29. Unless otherwise noted, the components of FIG. 3 may be the same as or generally similar to like-numbered components of FIGS. 1 and 2. Unlike the embodiment of FIGS. 1 and 2, in which only the reactant source 3 is present, in FIG. 3, the device 1 can supply inactive carrier gas to the injector 5 of the vaporizer 10 along an inactive gas line 33. As shown, a gas mass flow controller (MFC) 6 can meter the supply of gas along the inactive gas line 33. A fourth valve 31 can be provided along the inactive gas line 33 to regulate the flow of the inactive gas to the vaporizer 10. The fourth valve 31 can comprise an adjustable valve having a plurality of flow conductance settings in some embodiments. In other embodiments, the fourth valve 31 can comprise a binary, on/off valve, in which the valve 31 either permits or blocks flow of the inactive gas along the inactive gas line 33. In the embodiment of FIG. 3, the inactive gas can assist in supplying the reactant vapor to the reactor 21. For example, the inactive gas can assist in atomizing the reactant liquid in the injector 5, which improves the efficiency of vaporization.

Figure 4:
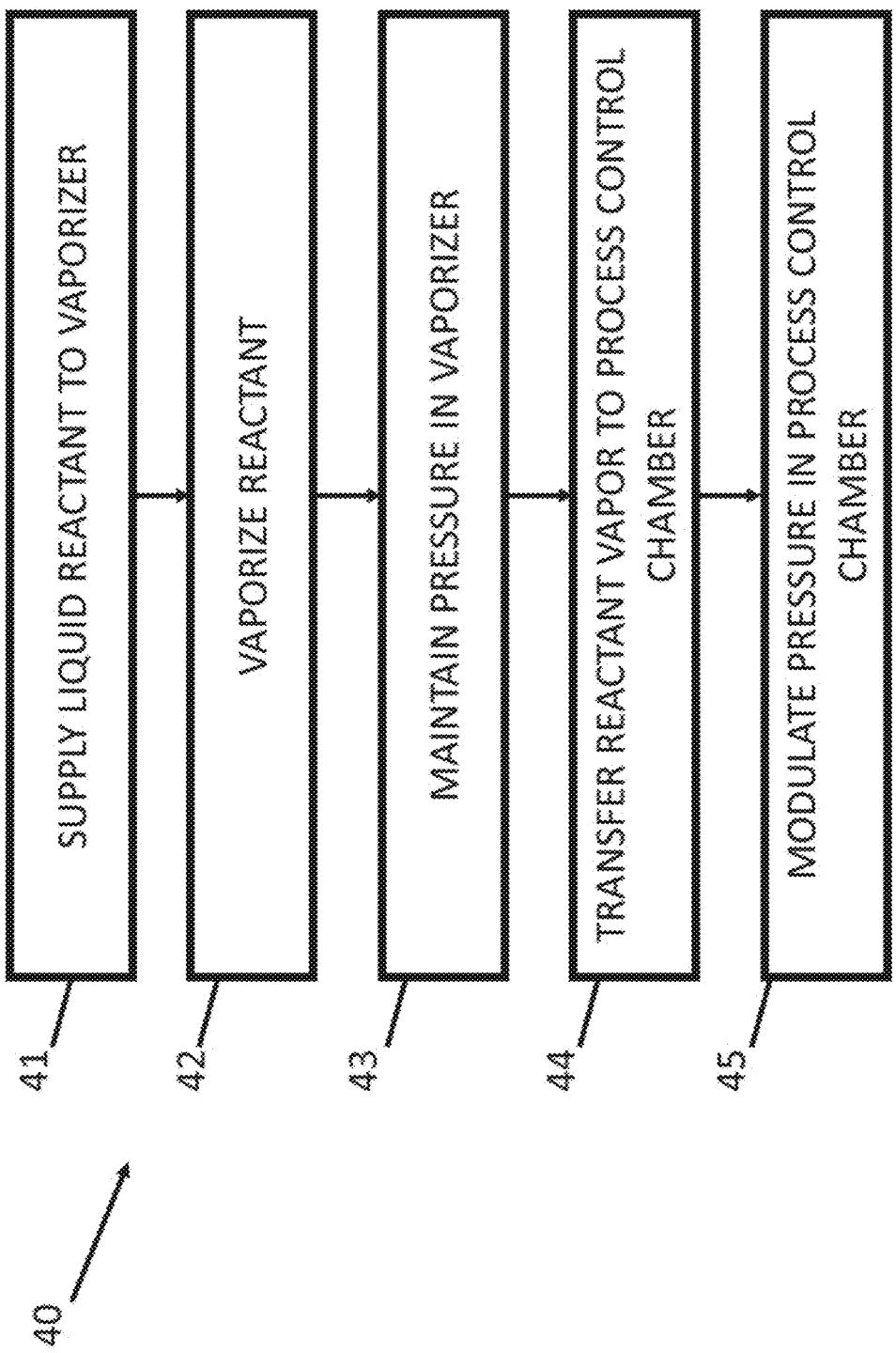
FIG. 4 is a flowchart illustrating a semiconductor processing method, according to various embodiments.

FIG. 4 is a flowchart illustrating a semiconductor processing method 40, according to various embodiments. The method 40 can begin in a block 41, in which a liquid reactant is supplied to a vaporizer. The vaporizer can be disposed in a first thermal zone at a first temperature. Turning to a block 42, the reactant can be vaporized in the vaporizer to form a reactant vapor. For the illustrated direct liquid injection embodiments, vaporizing can include atomizing as well as heating. For example, atomizing can be through a contactless injector that atomizes while mixing with high speed inert gas flow, while vaporization of the atomized or aerosolized reactant can be aided by one or more heaters (e.g., radiant heaters) that apply thermal energy to the vaporizer to increase its temperature.

In a block 43, a pressure in the vaporizer can be maintained at or below a dew point pressure of the reactant vapor (including any solvent) at the first temperature. As explained herein, in various embodiments, a first valve can be disposed upstream of the vaporizer. A first pressure transducer can be in fluid communication with the vaporizer. A first feedback control circuit can electrically connect the first pressure transducer and the first valve. The first feedback control circuit can ensure that the pressure is below a pressure set point so as to prevent condensation and incomplete evaporation.

Turning to a block 44, the reactant vapor can be transferred to a process control chamber downstream of the vaporizer. The process control chamber can be disposed in a second thermal zone at a second temperature that is greater than the first temperature. The process control chamber can meter the supply (or pulse) of reactant vapor to a reactor which can be disposed downstream of the process control chamber.

In a block 45, the pressure in the process control chamber can be modulated based at least in part on feedback of measured pressure in the process control chamber. The pressure in the process control chamber can be maintained at or below the maximum pressure of the reactant vapor (including any solvent) at the second temperature in order to maintain the vapor state of the reactant vapor. As explained herein, in various embodiments, a second valve can be disposed upstream of the process control chamber. A second pressure transducer can be in fluid communication with the process control chamber. A second feedback control circuit can electrically connect the second pressure transducer and the second valve. The second feedback control circuit can ensure that the pressure is below a pressure set point so as to prevent condensation and incomplete evaporation. Moreover, in some embodiments, the pressure set point upstream of the process control chamber can be stepped down from the vaporizer so as to modulate process parameters of the reactor processes.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the disclosed embodiments. Moreover, not all of the features, aspects and advantages described herein above are necessarily required to practice the present embodiments.

What is claimed is:

1. A semiconductor processing device comprising:
    a reactor;
    a vaporizer configured to provide a reactant vapor to the reactor, the vaporizer at a first temperature;
    a process control chamber between the vaporizer and the reactor, the process control chamber at a second temperature;
    a control system configured to modulate a pressure in the process control chamber based at least in part on feedback of measured pressure in the process control chamber and the second temperature of the process control chamber;
    wherein the control system is configured to maintain a pressure in the vaporizer at or below a dew point pressure of the reactant vapor based at least in part on feedback of measured pressure in the vaporizer and the first temperature of the vaporizer.

2. The device of claim 1, further comprising a first pressure transducer in fluid communication with the vaporizer, wherein the control system receives pressure measurements obtained by the first pressure transducer.

3. The device of claim 2, further comprising a first valve upstream of the vaporizer and in electrical communication with the first pressure transducer, the first valve configured to modulate the pressure in the vaporizer.

4. The device of claim 1, further comprising a second pressure transducer in fluid communication with the process control chamber, wherein the control system comprises processing electronics configured to modulate the pressure in the process control chamber and to maintain the pressure in the process control chamber at or below a dew point pressure of the reactant vapor.

5. The device of claim 4, wherein the control system is configured to modulate a pressure in the process control chamber based at least in part on feedback from one or more pressure measurements obtained by the second pressure transducer, the device further comprising a second valve upstream of the process control chamber, the second valve configured to modulate the pressure in the process control chamber.

6. The device of claim 5, further comprising a filter upstream of the second valve.

7. The device of claim 1, wherein the vaporizer is disposed in a first thermal zone at the first temperature and the process control chamber is disposed in a second thermal zone at the second temperature, the second temperature greater than the first temperature.

8. The device of claim 1, further comprising a third valve between the process control chamber and the reactor, the third valve configured to regulate flow of the reactant vapor to the reactor.

9. The device of claim 1, wherein the vaporizer is not connected to an inactive carrier gas supply line.

10. The device of claim 1, further comprising a liquid reactant source that conveys liquid reactant to the vaporizer, an atomizer upstream of the vaporizer, and a liquid mass flow controller (MFC) to meter a flow of the liquid reactant to the vaporizer.

11. A device for forming a vaporized reactant, the device comprising:
    a vaporizer configured to vaporize a reactant source into a reactant vapor, the vaporizer disposed in a first thermal zone at a first temperature;
    a process control chamber downstream of the vaporizer, the process control chamber disposed in a second thermal zone at a second temperature that is higher than the first temperature;
    a control system configured to:
    maintain a first pressure in the vaporizer at or below a dew point pressure of the reactant vapor based on the first temperature and a measured pressure of the vaporizer;
    modulate a pressure in the process control chamber based at least in part on feedback of measured pressure in the process control chamber and the second temperature.

12. The device of claim 11, further comprising a reactor downstream of the process control chamber.

13. The device of claim 11, further comprising a reactant source comprising a liquid reactant source that conveys the liquid reactant to the vaporizer via a liquid injection line coupled between the reactant source and the vaporizer.

14. The device of claim 11, wherein the control system is configured to maintain the pressure in the process control chamber at or below a dew point pressure of the reactant vapor at the second temperature.

15. The device of claim 11, further comprising:
    a first valve upstream of the vaporizer, a first pressure transducer in fluid communication with the vaporizer, and a first feedback circuit in electrical communication with the first pressure transducer and the first valve; and
    a second valve upstream of the process control chamber, a second pressure transducer in fluid communication with the process control chamber, and a second feedback circuit in electrical communication with the second pressure transducer and the second valve.

16. The device of claim 11, further comprising a filter upstream of the process control chamber, the filter disposed in the second thermal zone.

17. The device of claim 11, further comprising an atomizer upstream of the vaporizer and a liquid mass flow controller (MFC) to meter a flow of the liquid reactant to the vaporizer.

18. A device for forming a vaporized reactant, the device comprising:
    a vaporizer configured to form a reactant vapor from a liquid reactant;
    a process control chamber downstream of the vaporizer;
    a control system configured to modulate a pressure in the process control chamber based at least in part on feedback of measured pressure in the process control chamber and a temperature of the process control chamber;
    wherein the control system is configured to maintain a pressure in the vaporizer at or below a dew point pressure of the reactant vapor based at least in part on a temperature of the vaporizer.

19. The device of claim 18, further comprising a first pressure transducer in fluid communication with the vaporizer, wherein the control system comprises processing electronics configured to maintain the pressure in the vaporizer based at least in part on feedback from one or more pressure measurements obtained by the first pressure transducer.

20. The device of claim 19, further comprising a first valve upstream of the vaporizer and in electrical communication with the first pressure transducer, the first valve configured to modulate the pressure in the vaporizer.

21. The device of claim 18, further comprising a second pressure transducer in fluid communication with the process control chamber, wherein the control system comprises processing electronics configured to modulate the pressure in the process control chamber and to maintain the pressure in the process control chamber at or below a dew point pressure of the reactant vapor.

22. The device of claim 21, wherein the control system is configured to modulate a pressure in the process control chamber based at least in part on feedback from one or more pressure measurements obtained by the second pressure transducer, the device further comprising a second valve upstream of the process control chamber, the second valve configured to modulate the pressure in the process control chamber.

* * * * *